United States Patent [19]
LaRue

[11] Patent Number: 5,777,505
[45] Date of Patent: Jul. 7, 1998

[54] LOW-POWER CROSSPOINT SWITCH

[75] Inventor: George S. LaRue, Bellevue, Wash.

[73] Assignee: The Boeing Company, Seattle, Wash.

[21] Appl. No.: 591,738

[22] Filed: Jan. 25, 1996

[51] Int. Cl.⁶ .................................................. H03K 17/693
[52] U.S. Cl. .................................................. 327/407; 327/99
[58] Field of Search ................................. 327/63, 65, 72, 327/99, 407, 408, 409, 538, 543, 544, 545, 546

[56] References Cited

U.S. PATENT DOCUMENTS

| | | | |
|---|---|---|---|
| 3,737,588 | 6/1973 | Susi | 340/825.89 |
| 4,658,382 | 4/1987 | Tran et al. | 365/203 |
| 5,289,112 | 2/1994 | Brown et al. | 327/538 |
| 5,425,094 | 6/1995 | Noda | 379/292 |
| 5,430,400 | 7/1995 | Herlein et al. | 327/407 |
| 5,444,362 | 8/1995 | Chung et al. | 327/538 |
| 5,461,338 | 10/1995 | Hirayama et al. | 327/538 |
| 5,552,745 | 9/1996 | Pelella et al. | 327/407 |

Primary Examiner—Timothy P. Callahan
Assistant Examiner—My-Trang Nu Ton

Attorney, Agent, or Firm—Christensen, O'Connor, Johnson & Kindness PLLC

[57] ABSTRACT

A configurable circuit includes a first subcircuit (206) and a second subcircuit (410) each having a static power dissipation. A first bias circuit (402), coupled to the first subcircuit (206), provides a first bias level to the first subcircuit (206). Similarly, a second bias circuit (412), coupled to the second subcircuit (410), provides a second bias level to the second subcircuit (410). A logic circuit (403) is coupled to the first bias circuit (402) and the second bias circuit (412) and selectively provides a first signal to the first bias circuit (402). In response to the first signal, the first bias circuit (402) changes the bias level provided to the first subcircuit (206). The changed bias level disables the first subcircuit (206), substantially reducing the static power dissipation of the first subcircuit (206) while allowing the second subcircuit (410) to continue operating. In one embodiment, the circuit is a crosspoint switch with multiplexer subcircuits. The logic circuit (403) receives configuration information from an external controller and configures the multiplexers in response to the configuration information. The logic circuit can selectively disable one or more of the multiplexers to substantially reduce the static power dissipation of the selected multiplexers.

22 Claims, 4 Drawing Sheets

LOW-POWER CROSSPOINT SWITCH

FIELD OF THE INVENTION

The present invention relates to electronic switch circuits and, more particularly, to electronic crosspoint switch circuits.

BACKGROUND OF THE INVENTION

Crosspoint switch circuits are used in some applications requiring reconfigurable high speed switch networks. A crosspoint switch circuit is an electronic circuit that is designed to receive one or more input signals at one or more of input terminals and route the signals to one or more output terminals. An external controller is used to reconfigure the crosspoint switch to change the routing of the input signals to different output terminals. In some high speed crosspoint switch circuits, the high speed circuitry implementing the crosspoint switches has a significant static power dissipation (i.e., the power dissipation of the circuitry while in a static or non-transitioning state). Of course, static power dissipation is generally undesirable.

FIG. 1 is a simplified block diagram of a conventional crosspoint switch 100. One example of conventional crosspoint switch 100 is a model TQ8016, available from Triquint, the datasheet of which is incorporated herein by reference. Crosspoint switch 100 includes input terminals $I_1$-$I_N$ coupled to receive input signals $IN_1$-$IN_N$. Crosspoint switch 100 also includes output terminals $O_1$-$O_N$, where crosspoint switch 100 provides output signals $OUT_1$-$OUT_N$, respectively. A crosspoint switch circuit typically is used to selectively route one or more of input signals $IN_1$-$IN_N$ received at input terminals $I_1$-$I_N$ to one or more output terminals $O_1$-$O_N$ as output signals $OUT_1$-$OUT_N$.

Each input terminal $I_1$-$I_N$ is connected to a corresponding input lead of each of substantially identical N:1 multiplexers $MUX_1$-$MUX_N$. Thus, each input terminal is connected to all of the multiplexers. A control logic circuit 102 has an input port 104 coupled to receive control signals from an external controller (not shown), through which the external controller configures crosspoint switch circuit 100. The control signals are typically serial multi-bit signals that include the configuration information on an input to output basis (i.e., for each input signal, the control signals control which output terminal or terminals the input signal is to be routed to). Of course, the control signals can be multi-bit parallel signals in other embodiments. In response to the control signals, control logic circuit 102 configures each multiplexer $MUX_1$-$MUX_N$ to select one of the input signals and provide an output signal dependent on the selected input signal to output terminals $O_1$-$O_N$, respectively. In some applications of crosspoint switch 100, one or more of input terminals $I_1$-$I_N$ and one or more of output terminals $O_1$-$O_N$ are not used.

To configure each multiplexer, control logic circuit 102 includes output leads $106_1$-$106_N$ respectively connected to the SEL input lead of multiplexers $MUX_1$-$MUX_N$. Control logic circuit 102 provides a select signal to configure each multiplexer. Typically, each select signal is a K-bit signal (where $N=2^K$) so that control logic circuit 102 configures each multiplexer $MUX_1$-$MUX_N$ to select one of input signals $IN_1$-$IN_N$. Multiplexers $MUX_1$-$MUX_N$ then output the selected signals to output terminals $O_1$-$O_N$, respectively. In many high speed crosspoint switches using bipolar emitter coupled logic (ECL) or source coupled FET logic (SCFL), the logic dissipates power continually, whether the circuit is being used or not.

FIG. 2 is a schematic diagram of one type of conventional differential 2:1 multiplexer 200 used in an exemplary high speed crosspoint switch. Multiplexer 200 shown in FIG. 2 includes FETs in a current steering logic called SCFL. An ECL or current mode logic (CML) multiplexer embodiment can be formed by replacing the FETs with bipolar transistors. Multiplexer 200 is described for illustrative purposes, but can easily be extended to an N-input multiplexer by those skilled in the art of multiplexing circuits without undue experimentation. Although such multiplexers are well known, the following description of a GaAs implementation is provided for completeness.

In response to a differential select (SEL) signal from a control logic circuit 201, multiplexer 200 selects either differential input signal A or differential input signal B and provides a differential output signal at differential output terminal 202 having a logic level that can be level shifted to provide a logic level equivalent to the selected input signal's. Control logic circuit 201 provides the differential SEL signal to configure multiplexer 200 in a manner substantially similar to that of control logic circuit 102 (FIG. 1).

Multiplexer 200 includes a bias circuit 204 and a multiplexing circuit 206. Bias circuit 204 includes a n-channel field effect transistor (FET) 208 with its gate connected to its drain at a node N1. The source of FET 208 is connected to a source of voltage VSS (not shown). In this embodiment, voltage VSS serves as ground potential for multiplexer 200. In addition, the gate and drain of FET transistor 208 are coupled through a resistor R1 to a source of voltage VDD (not shown). The voltage at node N1 is a voltage $V_{BIAS}$ for biasing multiplexing circuit 206. The resistance of resistor R1 and the width of FET 208 are predetermined so that voltage $V_{BIAS}$ at node N1 properly biases multiplexing circuit 206 over a range of temperature and process variations.

Multiplexing circuit 206 includes a n-channel FET 210 that serves as a current source. The gate of FET 210 is connected to node N1 bias circuit 202. Thus, the gate voltage of FET 210 is substantially equal to voltage $V_{BIAS}$. The source of FET 210 is coupled to the VSS voltage source. The drain of FET 210 is connected to the drains of n-channel FETs 212 and 214. The FETs 212 and 214 form a differential pair which steers the current from the current source.

The gates of FETs 212 and 214, respectively, are coupled to receive the differential SEL signal from control logic circuit 201. The differential SEL signal includes SEL(+) and SEL(−) component signals. The differential SEL signal is in a logic one state when the SEL(+) component signal is at a logic high voltage level (and, thus, the SEL(−) component signal is at a logic low voltage level). Conversely, the differential SEL signal is in a logic zero state when the SEL(+) component signal is at a logic low voltage level (and, thus, the SEL(−) component signal is at a logic high voltage level). Differential input signals A and B are defined similarly with A(+) and A(−) component signals and B(+) and B(−) component signals, respectively. As a result, FET 212 is on and FET 214 is off when the SEL signal is in a logic one state. Conversely, FET 212 is off and FET 214 is on when the SEL signal is in a logic zero state.

The drains of FETs 212 and 214 are respectively connected to the sources of a FET differential pair 216 and FET differential pair 218. Consequently, the SEL signal operates to select either differential pair 216 when the SEL signal is at a logic one state, or differential pair 218 when the SEL signal is at a logic zero state. Thus, when FET 212 is on (and, thus, FET 214 is off), differential pair 216 conducts a current substantially equal to the current conducted by current source FET 210. Conversely, when FET 214 is on (and, thus, FET 212 is off), differential pair 218 conducts a current substantially equal to the current conducted by current source FET 210.

In this conventional SCFL multiplexer, the gates of the differential pair 216 are coupled to receive differential input signal A. Differential pair 216 includes a first FET 216(+) that receives the A(+) component signal at its gate, and a second FET 216(−) that receives the A(−) component signal at its gate. Similarly, the gates of the differential pair 218 are coupled to receive differential input signal B with a FET 218(+) having its gate coupled to receive the B(+) component signal of differential input signal B and a FET 218(−) having its gate coupled to receive the B(−) component signal of differential input signal B. The drains of FETs 216(+) and 218(+) are respectively connected to the (−) and (+) terminals of differential output terminal 202.

The drains of FETs 216(+) and 218(+) are also coupled through a resistor 222 to the VDD voltage source, and the drains of FETs 216(−) and 218(−) are also coupled through a resistor 224 to the VDD voltage source. Thus, the selected differential pair operates to steer current through resistor 222 when the differential input signal received by the selected differential pair is in a logic one state, or through resistor 224 when the differential input signal is in a logic zero state. Consequently, when the differential input signal received by the selected differential pair is in a logic zero state, the selected differential pair pulls down the voltage at the (+) terminal of differential output terminal 202 while resistor 224 pulls up the voltage at the (−) terminal. Conversely, when the differential signal received by the selected differential pair is in a logic one state, the selected differential pair pulls down the voltage at the (−) terminal while resistor 222 pulls up the voltage at the (+) terminal.

For example, when the SEL signal is in a logic one state, FET 212 is turned on, thereby selecting differential pair 216. At substantially the same time, FET 214 is turned off and differential pair 218 is unselected. Thus, substantially all of the current conducted by current source FET 210 is conducted through differential pair 216 and substantially no current flows through differential pair 218.

Then if differential input signal A is in a logic one state, FET 216(+) is turned on, thereby steering the current conducted by current source FET 210 through resistor 222 and pulling down the voltage at the (−) terminal of differential output terminal 202. At substantially the same time, FET 216(−) is turned off, thereby causing resistor 224 to pull up the voltage at the (+) terminal of differential output terminal 202. Accordingly, multiplexer 200 provides a logic one signal at differential output terminal 202, corresponding to the logic state of differential input signal A.

Conversely, if differential input signal A is in a logic zero state, FET 216(−) is turned on, thereby steering the current conducted by current source FET 210 through resistor 224 and pulling down the voltage at the (+) terminal of differential output terminal 202. At substantially the same time, FET 216(+) is turned off, thereby causing resistor 222 to pull up the voltage at the (−) terminal of differential output terminal 202. Thus, multiplexer 200 provides a logic zero signal at differential output terminal 202, corresponding to the logic state of differential input signal A.

When the SEL signal is in a logic zero state, differential pair 216 is unselected and differential pair 218 is selected. Differential pair 218 then operates in a similar manner as described above for differential pair 216, except that the operation of differential pair 218 is dependent on the logic state of differential input signal B instead of differential input signal A.

In operation, current source FET 210 of multiplexer 200 conducts a static current through either resistor 222 or 224, depending on the logic state of the differential input signal received by the selected differential pair. Consequently, current source FET 210 constantly conducts a current while the crosspoint switch is operating. Thus, even when multiplexer 200 is not being used by the crosspoint switch, multiplexer 200 has a significant static power dissipation. In addition, bias circuit 204 also conducts a static current. Because current source FET 210 and bias circuit 204 conduct a static current, multiplexer 200 dissipates a significant static current. Such static power dissipation is undesirable in many applications.

SUMMARY OF THE INVENTION

In accordance with the present invention, a circuit capable of being configured to reduce static power dissipation is provided. In one embodiment, the circuit includes first and second subcircuits each having static power dissipation. A first bias circuit, coupled to the first subcircuit, provides a first bias level to the first subcircuit. Similarly, a second bias circuit, coupled to the second subcircuit, provides a second bias level to the second subcircuit. A logic circuit coupled to the first and second bias circuit selectively provides a first signal to the first bias circuit. In response to the first signal, the first bias circuit changes the bias level provided to the first subcircuit. The changed bias level disables the first subcircuit, thereby substantially reducing the static power dissipation of the first subcircuit, while allowing the second subcircuit to continue operating.

In another embodiment, a crosspoint switch capable of being configured to reduce static power dissipation is provided. The crosspoint switch includes a logic circuit and multiplexers. Each multiplexer has static power dissipation. The logic circuit receives configuration information from an external controller and configures the multiplexers in response to the configuration information. When configuring the multiplexers, if instructed to do so, the logic circuit selectively disables one or more of the multiplexers, thereby substantially reducing the static power dissipation of the selectively disabled multiplexers.

In a further refinement, the multiplexers are source-coupled field effect transistor logic (SCFL) multiplexers. SCFL multiplexers have a significant static power dissipation. In this refinement, each multiplexer has an associated bias circuit that provides a bias voltage to bias a current source in the multiplexer. When the crosspoint switch is configured, any unused multiplexer in the crosspoint switch is selectively disabled by causing the multiplexer's associated bias circuit to discharge the bias voltage. Thus, the current source of the multiplexer is shut off, thereby substantially reducing the static power dissipation of the multiplexer.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1:
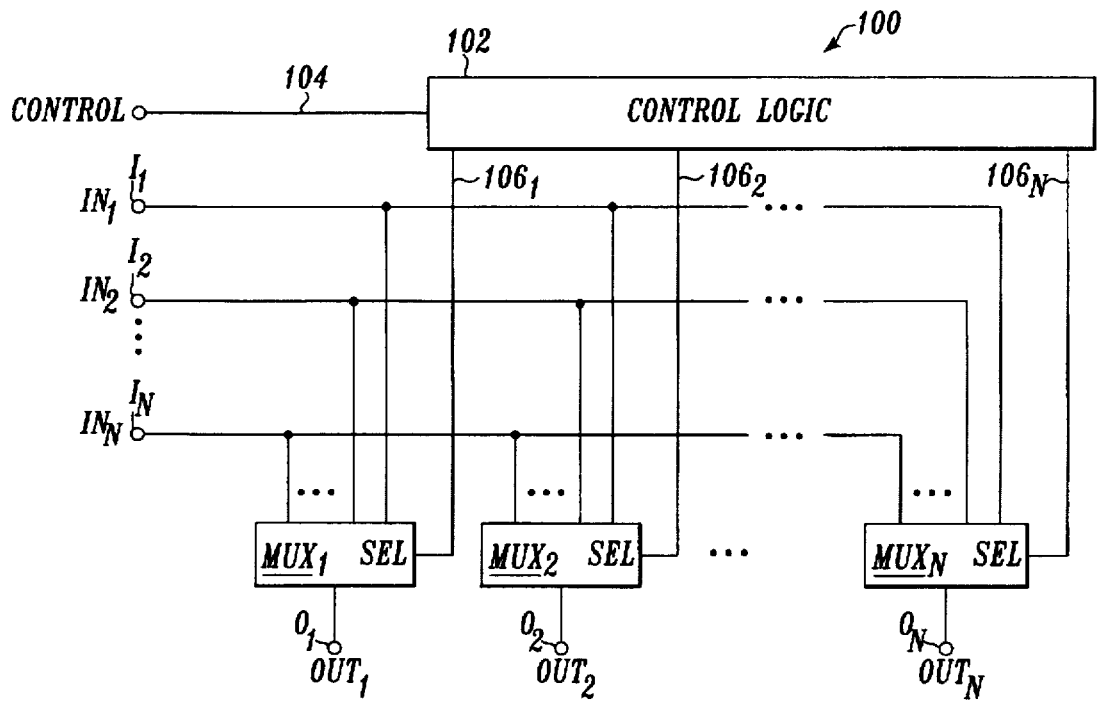
FIG. 1 is a simplified block diagram of a conventional crosspoint switch.
Figure 3:
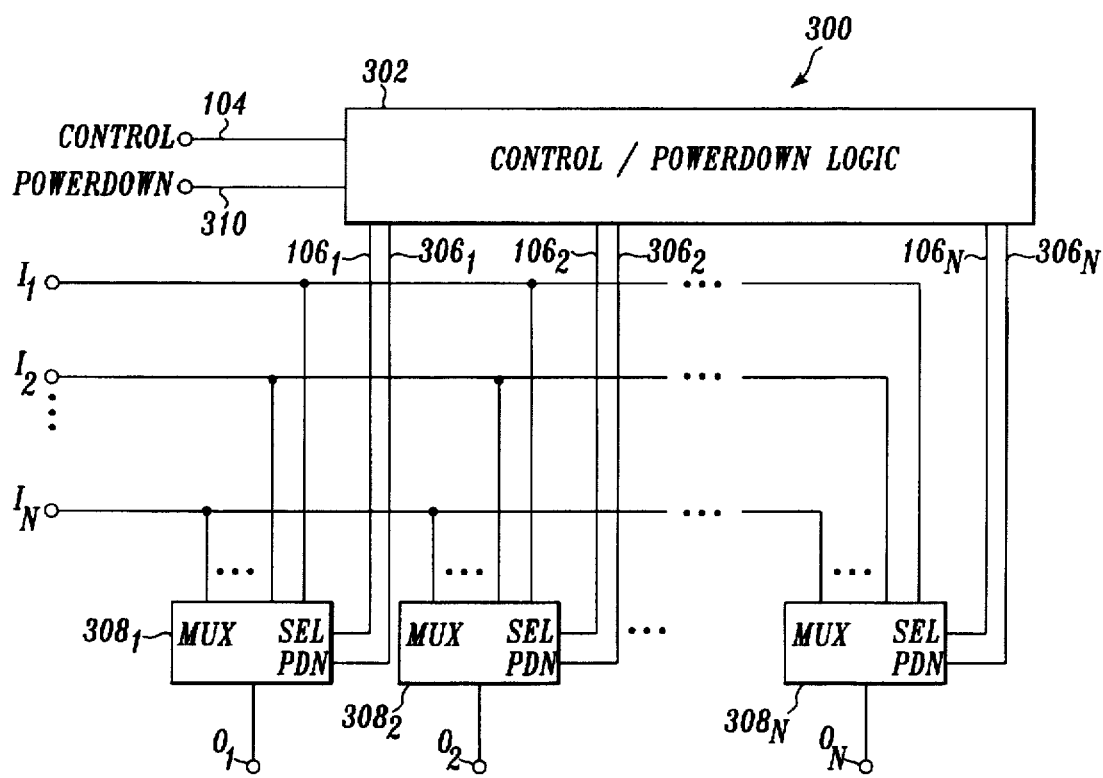
FIG. 3 is a block diagram of a crosspoint switch according to one embodiment of the present invention.

FIG. 3 is a block diagram of a crosspoint switch 300 according to one embodiment of the present invention. Crosspoint switch 300 is substantially similar to crosspoint switch 100 (FIG. 1) except that crosspoint switch 300 includes a control and powerdown logic circuit 302 instead of control logic circuit 102 (FIG. 1). Control and powerdown logic circuit 302 performs all of the functions of control logic circuit 102. Thus, control and powerdown logic circuit 302 receives control signals containing configuration information from an external controller (not shown) and uses the control signal data to configure or reconfigure crosspoint switch 300.

In addition, control and powerdown logic circuit 302 selectively outputs powerdown signals on any of output leads $306_1$-$306_N$, depending on the configuration of crosspoint switch 300. Output leads $306_1$-$306_N$ are connected to the powerdown (PDN) input leads of multiplexers $308_1$-$308_N$, respectively. The controller can supply configuration information into crosspoint switch 300. Thus, the unused multiplexer circuits are known, and control and powerdown logic circuit 302 can provide a powerdown signal via output leads $306_1$-$306_N$ to each unused multiplexer circuit to reduce static power dissipation.

Control and powerdown logic circuit 302 can be implemented by those skilled in the art of crosspoint switches without undue experimentation by modifying logic circuit 102 (FIG. 1) to provide the powerdown signals to the unused multiplexers. For example, when configuring crosspoint switch 300, the external controller can include in the configuration information which multiplexers are to receive powerdown signals. Alternatively, logic circuit 302 can by default provide a powerdown signal to each multiplexer, which is then overridden by configuring the multiplexer to select an input signal. Thus, for example, if all the multiplexers except multiplexer 308, are used in the current configuration of crosspoint switch 300, control and powerdown logic circuit 302 provides a powerdown signal to multiplexer $308_1$, via output lead $306_1$. Thus, multiplexer $308_1$, is powered down to reduce static power dissipation while multiplexers $308_2$-$308_N$ continue to operate.

Further, in this embodiment, control and powerdown logic circuit 302 has an additional input lead 310, coupled to the external controller (not shown). The external controller provides a powerdown enable signal on input lead 310 that, when asserted, enables control and powerdown logic circuit 302 to output powerdown signals on output leads $306_1$-$306_N$. This feature is optional. In those embodiments without input lead 310, control and powerdown logic circuit 302 by default provides a powerdown signal to any unused multiplexer. Of course, multiplexers $308_1$-$308_N$ include all of the functions of multiplexers $MUX_1$-$MUX_N$ (FIG. 1) in addition to the powerdown function described above. Accordingly, multiplexers $308_1$-$308_N$ are configured to select an input signal as described above for multiplexers $MUX_1$-$MUX_N$ (FIG. 1).

Figure 2:
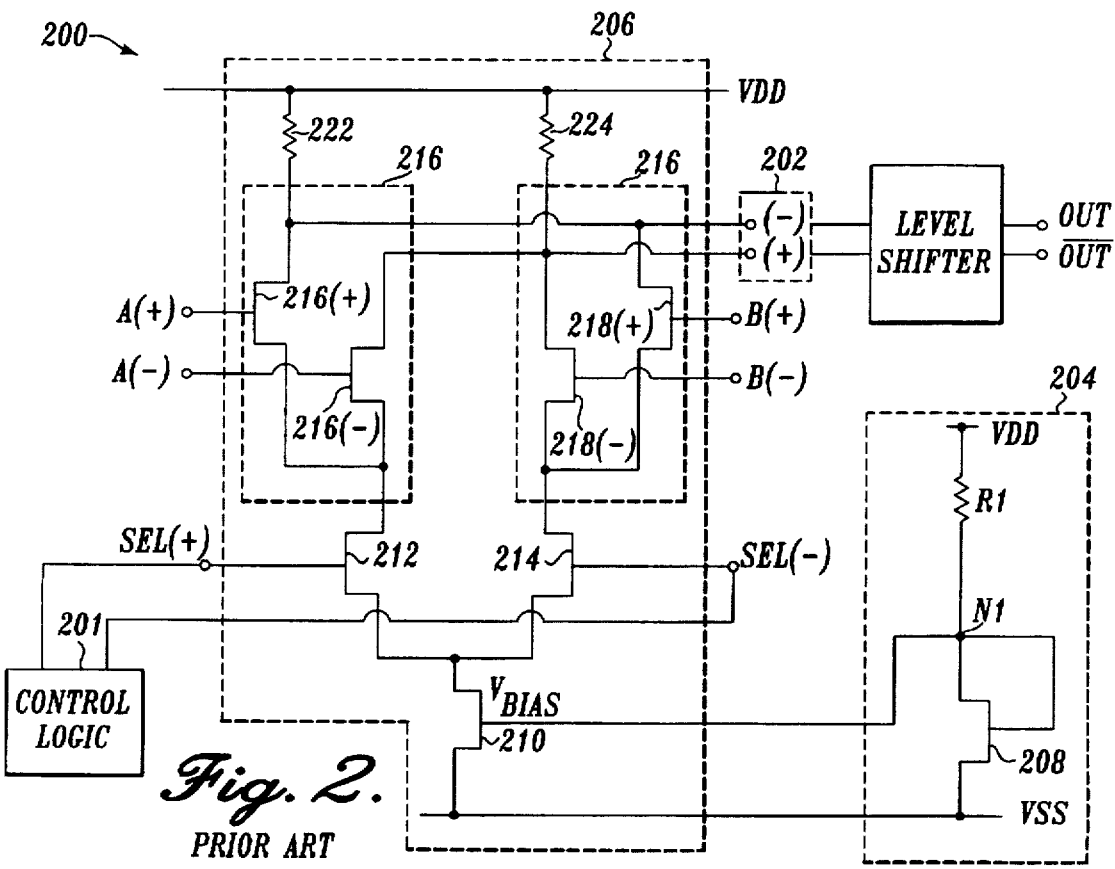
FIG. 2 is a schematic diagram of a conventional multiplexer.
Figure 4:
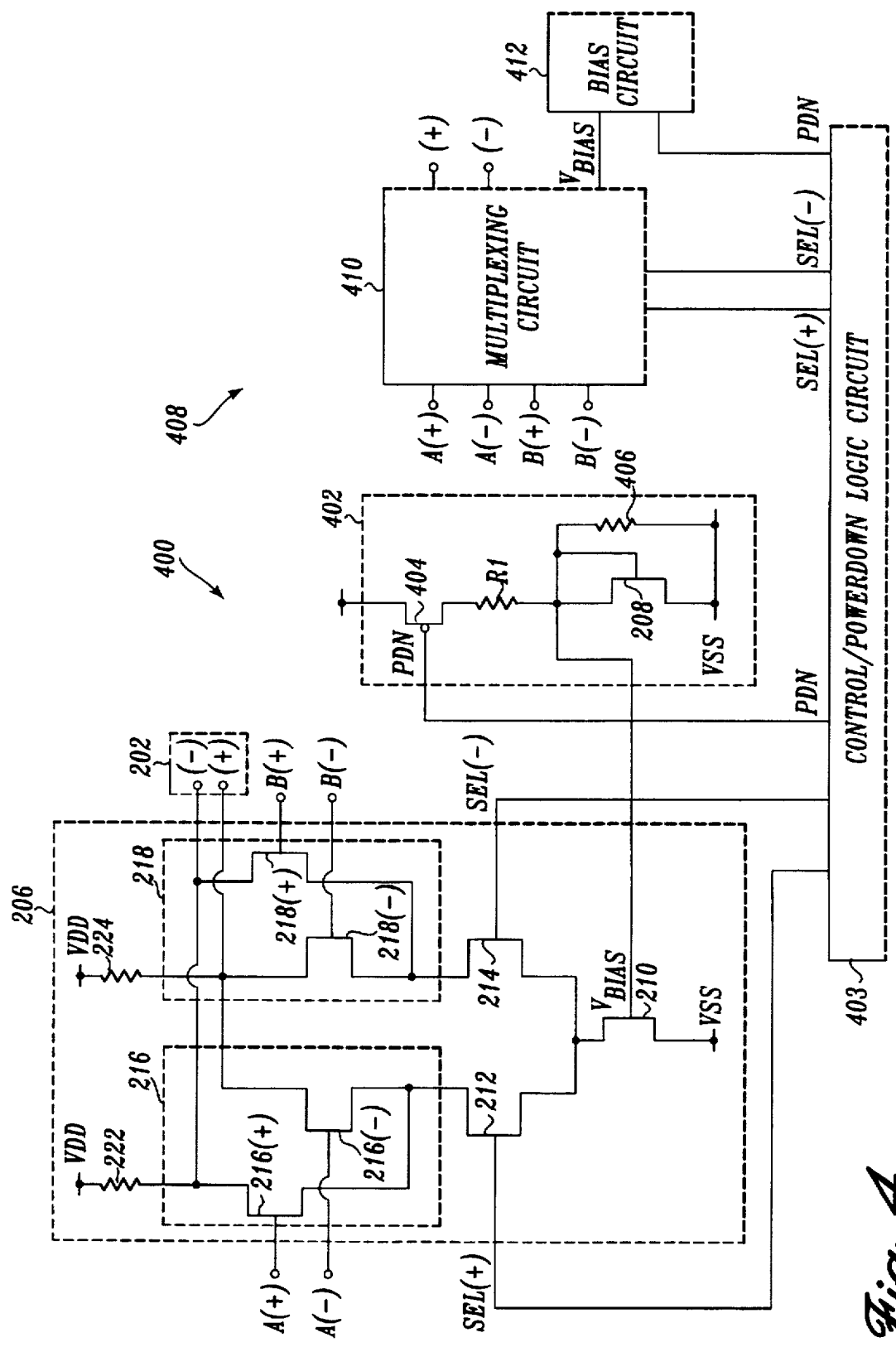
FIG. 4 is a schematic diagram of a multiplexer according to one embodiment of the present invention.

FIG. 4 is a schematic diagram of a differential multiplexer 400 used in a crosspoint switch, according to one embodiment of the present invention. Multiplexer 400 is substantially similar to multiplexer 200 (FIG. 2), except that multiplexer 400 includes bias circuit 402 instead of bias circuit 204 (FIG. 2). As described above in conjunction with FIG. 2, multiplexing circuit 206 is part of a conventional 2:1 SCFL multiplexer. Multiplexing circuit 206 receives differential input signals A and B. As stated above, multiplexing circuit 206 is configured by the differential SEL signal to select either differential input signal A or differential input signal B. In this embodiment, a control and powerdown logic circuit 403 provides the SEL signal instead of control logic circuit 201 (FIG. 2). Control and powerdown logic circuit 403 configures multiplexer 400 in a manner substantially similar to that of control and powerdown logic circuit 302 (FIG. 3). Multiplexing circuit 206 outputs at output terminal 202 a differential signal logically equivalent to the logic state of the selected input signal.

Similar to bias circuit 204 (FIG. 2), bias circuit 402 provides the bias voltage for current source FET 210. Bias circuit 402 is substantially similar to bias circuit 204, except that bias circuit 402 includes a p-channel FET 404 with its channel coupling resistor R1 to the VDD voltage source, and a resistor 406 coupling the gate of FET 208 to the VSS voltage source. FETs 208 and 404 and resistors R1 and 406 form a voltage divider providing bias voltage $V_{BIAS}$ to the gate of current source FET 210 of multiplexing circuit 206. The widths of FETs 208 and 404 and the values of resistors R1 and 406 are chosen so that voltage $V_{BIAS}$ is maintained at a chosen value (i.e., chosen to properly bias current source FET 210) over a range of temperature and process variations.

In addition, FET 404 has its gate coupled to receive a powerdown (PDN) signal from control and powerdown logic circuit 403. Thus, when control and powerdown logic circuit 403 does not provide the PDN signal, the gate voltage of FET 404 is at a logic low level. As a result, p-channel FET 404 is turned on and voltage $V_{BIAS}$ is maintained at the chosen value. In contrast, when control and powerdown logic circuit 403 provides the PDN signal, p-channel FET 404 is turned off, thereby creating an open circuit between the VDD voltage source and resistor R1. Consequently, resistor 406 discharges the voltage at node N1 and, causing voltage $V_{BIAS}$ to be substantially equal to ground potential. As a result, current source FET 210 is turned off, thereby substantially reducing the static power dissipation of multiplexing circuit 206.

Further, because the channels of p-channel FET 404 and n-channel FET 208 are coupled in series, FETs 404 and 208 form a complementary FET structure. Consequently, when the PDN signal is asserted, bias circuit 402 no longer conducts current, thereby further reducing the static power dissipation of multiplexer 400. In this embodiment, the FETs of multiplexer 400 are preferably implemented in GaAs technology. Accordingly, FETs 208 and 404 form a complementary heterojunction field effect transistor (CHFET) structure.

Other embodiments of the invention may delete resistor 406. Diode-configured FET 208 will pull down the voltage at node N1 (i.e., voltage $V_{BIAS}$) until the voltage $V_{BIAS}$ is just below the threshold voltage of FET 208. Consequently, current source FET 210 will conduct little or no current, thereby reducing the static power dissipation of multiplexer 400. In a further refinement, FET 208 may be implemented with a depletion device and FET 210 may be implemented with an enhancement device. As a result, depletion FET 208 will discharge node N1 to below the threshold voltage of enhancement current source FET 210, thereby turning off current source FET 210 and reducing the static power dissipation of multiplexer 400.

Although multiplexer 400 in the above-described embodiment of the invention is a 2:1 multiplexer, as will be readily appreciated by those skilled in the art of SCFL multiplexers a larger multiplexer can be used in crosspoint switch 300 (FIG. 3). An N:1 multiplexer can be easily created by adding, for each additional input signal, an additional differential pair (substantially identical to differential pair 216) and corresponding FET selection switch (substantially identical to FET 212) between current source FET 210 and load resistors 222 and 224. Alternatively, an N:1 multiplexer can be created by using N/2 2:1 multiplexers identical to multiplexer 200 to receive the input signals and then cascading the output signals of these 2:1 multiplexers to N/4 identical 2:1 multiplexers, and so on, in a tree-like configuration. Of course, different combinations of cascaded multi-input multiplexers can be used. For example, four 4:1 multiplexers can be implemented as describe above and then cascaded one 4:1 multiplexer to form a 16:1 multiplexer. All of the multiplexers forming the N:1 multiplexers can receive their bias inputs from the same circuit 402 and be powered down together.

FIG. 4 also shows a second differential multiplexer 408 connected to control and powerdown logic circuit 403. Multiplexer 408 is substantially identical to multiplexer 400. Control and powerdown logic circuit 403 provides a differential select signal to a multiplexing circuit 410 of multiplexer 408 so that multiplexer 408 selects either differential input signal A or differential input signal B as described above for multiplexing circuit 206 of multiplexer 400. Control and powerdown logic circuit also provides a PDN signal to a bias circuit 412 of multiplexer 408 to disable multiplexing circuit 410 as described above for bias circuit 402 and multiplexing circuit 206 of multiplexer 400. Together, multiplexers 400 and 408 implement a 2×2 crosspoint switch circuit.

Figure 5:
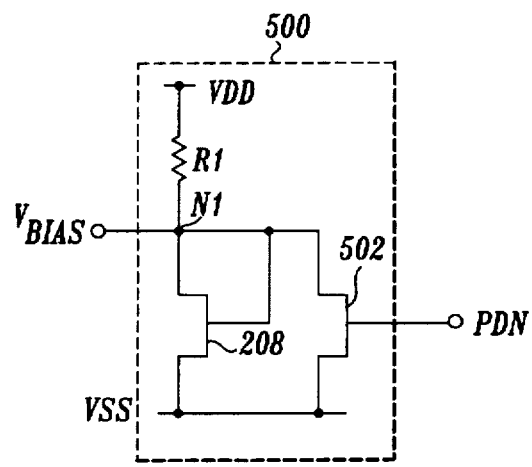
FIG. 5 is a schematic diagram of an alternative embodiment of a bias circuit according to the present invention.

FIG. 5 is a schematic diagram of a bias circuit 500 according to an alternate embodiment of the present invention. Bias circuit 500 can replace CHFET bias circuit 402 in multiplexer 400 (FIG. 4). Bias circuit 500 is similar to bias circuit 204 (FIG. 2) except that bias circuit 500 includes a n-channel enhancement FET 502 with its drain electrically connected to node N1 and its source connected to the VSS voltage source. The gate of FET 502 is coupled to receive the PDN signal from control and powerdown logic circuit 403 (FIG. 4). When the PDN signal is not asserted, FET 502 is off and the proper bias is produced. However, when the PDN signal is asserted, FET 502 is turned on, thereby pulling down the voltage at node N1. FET 502 is large enough to pull down the voltage at node N1 to a logic low level. As a result, voltage $V_{BIAS}$ is at a logic low level, which causes current source FET 210 in multiplexer 400 (FIG. 4) to turn off and reduce the static power dissipation of multiplexer 400.

Figure 6:
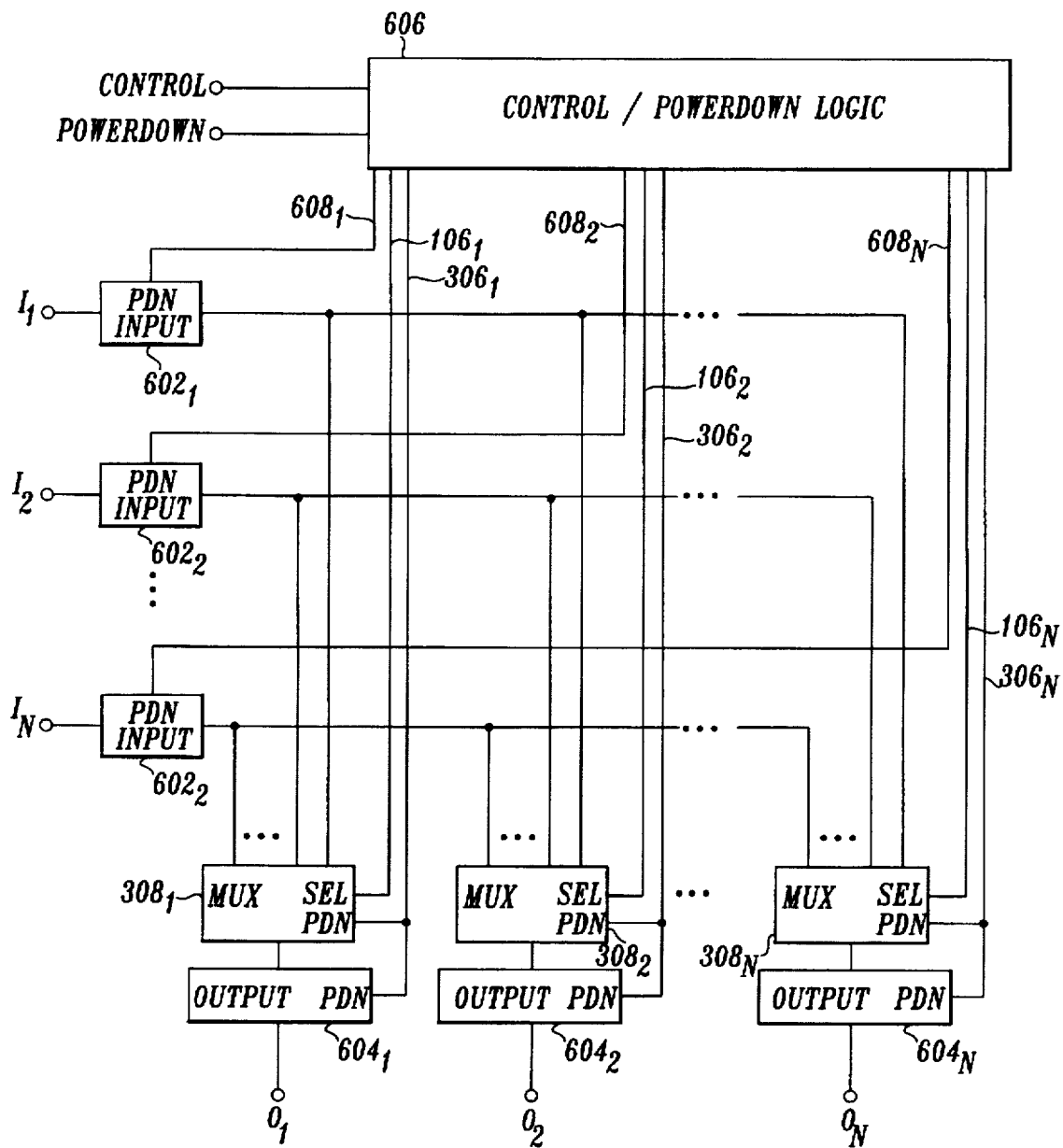
FIG. 6 is a block diagram of another embodiment of a crosspoint switch according to the present invention.

FIG. 6 is a block diagram of another embodiment of a crosspoint switch 600 according to the present invention. Crosspoint switch 600 is substantially similar to crosspoint switch 300 (FIG. 3) except that crosspoint switch 600 includes input circuits $602_1$-$602_N$ and output circuits $604_1$-$604_N$ connected to input terminals $I_1$-$I_N$ and output terminals $O_1$-$O_N$, respectively. In addition, crosspoint switch 600 includes control and powerdown logic circuit 606 instead of control and powerdown logic circuit 302 (FIG. 3). Control and powerdown logic circuit 606 is substantially similar to control and powerdown logic circuit 302. That is, in addition to providing PDN signals to multiplexers $308_1$-$308_N$ as described above for control and powerdown logic circuit 302, control and powerdown logic circuit 606 includes output leads $608_1$-$608_N$ respectively connected to input circuits $602_1$-$602_N$. Control and powerdown logic circuit 606 is capable of selectively providing additional PDN signals to input circuits $602_1$-$602_N$ through output leads $608_1$-$608_N$, respectively. Input circuits $602_1$-$602_N$ are conventional input circuits that can be disabled to reduce power dissipation. Alternatively, the input circuits can be similar to conventional SCFL buffers or inverters, but with bias circuits substantially identical to bias circuit 402 (FIG. 4) or bias circuit 500 (FIG. 5). Accordingly, in response to the PDN signal, the current source FET of the buffer or inverter is turned off to reduce static power dissipation.

Output leads $306_1$-$306_N$ of control and powerdown logic circuit 606 are connected to the PDN leads of output circuits $604_1$-$604_N$. Consequently, control and powerdown logic circuit 606, when it selectively powers down a multiplexer (described above in conjunction with FIG. 3), it also powers down the multiplexer's associated output circuit. Output circuits $604_1$-$604_N$ are conventional output circuits that can be disabled to reduce power dissipation. Thus, as well as powering down the unused multiplexers, crosspoint switch 600 is capable of further reducing power dissipation by powering down input circuits $602_1$-$602_N$ and output circuits $604_1$-$604_N$ corresponding to the unused input and output terminals of the crosspoint switch.

The embodiments of the invention described above are illustrative of the principles of the invention and are not intended to limit the invention to the particular embodiments described. For example, in other embodiments, circuits other than crosspoint switches may include powerdown circuitry according to the principles of the present invention. In addition, other embodiments have subcircuits that use a bias current instead of a bias voltage. The embodiments described can be easily modified by those skilled in the art without undue experimentation to cause the bias circuits to change the bias currents to disable such subcircuits. In addition, in other embodiments emitter coupled logic circuitry can be used instead of the SCFL circuitry described. Accordingly, the embodiments of the invention described above are illustrative of the principles of the invention and are not intended to limit the invention to the particular embodiments described. While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A circuit comprising:
    a first subcircuit having static power dissipation;
    a first bias circuit coupled to said first subcircuit for providing a first bias level to said first subcircuit;
    a second subcircuit having static power dissipation;
    a second bias circuit coupled to said second subcircuit for providing a second bias level to said second subcircuit; and
    a logic circuit coupled to said first bias circuit and said second bias circuit for selectively providing a first signal to said first bias circuit, said first bias circuit configured for changing said bias level provided by said first bias circuit to said first subcircuit in response to said first signal, said changed bias level of said first bias circuit disabling said first subcircuit to substantially reduce the static power dissipation of said first subcircuit.

2. The circuit of claim 1 wherein said logic circuit selectively provides a second signal to said second bias circuit, said second bias circuit changing said bias level provided by said second bias circuit to said second subcircuit in response to said second signal, said changed bias level of said second bias circuit disabling said second subcircuit, to substantially reduce the static power dissipation of said second subcircuit.

3. The circuit of claim 1 wherein said first subcircuit comprises a multiplexer implemented in source-coupled field effect transistor logic.

4. The circuit of claim 1 wherein said bias level provided by said first bias circuit is a bias voltage.

5. The circuit of claim 4 wherein said first bias circuit comprises a switch having a control lead configured to receive said first signal and wherein in response to said first signal said switch creates an open circuit in said first bias circuit.

6. The circuit of claim 5 wherein said first bias circuit further comprises a pulldown element coupled to an output lead of said first bias circuit, said pulldown element causing said bias voltage of said first bias circuit to be substantially equal to ground potential.

7. The circuit of claim 6 wherein said pulldown element comprises a resistor coupled to said output lead of said first bias circuit and a source of ground potential.

8. The circuit of claim 6 wherein said pulldown element comprises a field effect transistor coupled to said output lead of said first bias circuit and a source of ground potential.

9. A crosspoint switch circuit having a first input terminal, a second input terminal, a first output terminal and a second output terminal, said crosspoint switch comprising:

a first multiplexer having a first input lead coupled to said first input terminal, a second input lead coupled to said second input terminal and an output lead coupled to said first output terminal, said first multiplexer having static power dissipation;

a second multiplexer having a first input lead coupled to said first input terminal, a second input lead coupled to said second input terminal and an output lead coupled to said second output terminal, said second multiplexer having static power dissipation; and a logic circuit coupled to said first multiplexer and said second multiplexer, said logic circuit configured to receive configuration information from an external controller and, responsive to said configuration information, provides a first signal to said first multiplexer to disable said first multiplexer to substantially reduce the static power dissipation of said first multiplexer.

10. The circuit of claim 9 wherein:

said first multiplexer comprises a first multiplexing circuit, a second multiplexing circuit, a first bias circuit and a second bias circuit;

said first bias circuit is coupled to said first multiplexing circuit, for providing a first bias level to said first multiplexing circuit;

said second bias circuit is coupled to said second multiplexing circuit for providing a second bias level to said second multiplexing circuit; and said first bias circuit changes said bias level provided by said first bias circuit to said first multiplexing circuit in response to said first signal, said changed bias level of said first bias circuit disabling said first multiplexing circuit.

11. The circuit of claim 10 wherein said logic circuit selectively provides a second signal to said second bias circuit, said second bias circuit changing said bias level provided by said second bias circuit to said second multiplexing circuit in response to said second signal, said changed bias level of said second bias circuit disabling said second multiplexing circuit to substantially reduce the power dissipation of said second multiplexing circuit.

12. The circuit of claim 11 wherein said first multiplexing circuit and said second multiplexing circuit are implemented in source-coupled field effect transistor logic.

13. The circuit of claim 10 wherein said bias level provided by said first bias circuit is a bias voltage.

14. The circuit of claim 13 wherein said first multiplexing circuit comprises a current source, said current source having a control lead coupled to receive said bias voltage provided by said first bias circuit.

15. The circuit of claim 14 wherein said first bias circuit comprises a switch having a control lead configured to receive said first signal and wherein in response to said first signal said switch causes said bias voltage provided by said first bias circuit to change to a level that disables said current source.

16. The circuit of claim 15 wherein said first bias circuit further comprises a pulldown element coupled to an output lead of said first bias circuit, said pulldown element causing said bias voltage of said first bias circuit to be substantially equal to ground potential.

17. The circuit of claim 16 wherein said pulldown element comprises a resistor coupled to said output lead of said first bias circuit and a source of ground potential.

18. The circuit of claim 16 wherein said pulldown element comprises a field effect transistor coupled to said output lead of said first bias circuit and a source of ground potential.

19. A method for reducing static power dissipation in a circuit, said method comprising:

selectively providing a first signal to a first bias circuit of said circuit, said first bias circuit providing a first bias level to a first subcircuit of said circuit, said first subcircuit having static power dissipation;

in response to said first signal, changing said first bias level provided by said first bias circuit to said first subcircuit; and in response to said changed first bias level, disabling said first subcircuit, whereby said power dissipation of said first subcircuit is substantially reduced.

20. The method of claim 19 further comprising:

selectively providing a second signal to a second bias circuit of said circuit, said second bias circuit providing a second bias level to a second subcircuit of said circuit, said second subcircuit having a static power dissipation;

changing said second bias level provided by said second bias circuit to said second subcircuit in response to said second signal; and disabling said second subcircuit in response to said changed second bias level, whereby said power dissipation of said second subcircuit is substantially reduced.

21. The method of claim 19 wherein disabling said first subcircuit further comprises disabling a current source biased by said bias level provided by said first bias circuit.

22. A structure for reducing static power dissipation in a circuit, said circuit including a first bias circuit, a first subcircuit, a second bias circuit and a second circuit, said structure comprising:

means for selectively providing a first signal to said first bias circuit of said circuit, said first bias circuit providing a first bias level to said first subcircuit of said circuit, said first subcircuit having static power dissipation;

means for changing said first bias level provided by said first bias circuit to said first subcircuit in response to said first signal; and means for disabling said first subcircuit in response to said changed first bias level, whereby said power dissipation of said first subcircuit is substantially reduced.

* * * * *